United States Patent
Tsuchida et al.

(10) Patent No.: US 11,081,869 B2
(45) Date of Patent: Aug. 3, 2021

(54) ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Toshiyuki Tsuchida, Yokkaichi (JP); Shigeki Yamane, Yokkaichi (JP); Xiaoguang Zheng, Osaka (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/613,620

(22) PCT Filed: May 9, 2018

(86) PCT No.: PCT/JP2018/017884
§ 371 (c)(1),
(2) Date: Nov. 14, 2019

(87) PCT Pub. No.: WO2018/212032
PCT Pub. Date: Nov. 22, 2018

(65) Prior Publication Data
US 2020/0194984 A1      Jun. 18, 2020

(30) Foreign Application Priority Data

May 18, 2017   (JP) .............................. JP2017-098980

(51) Int. Cl.
*H02G 3/00*      (2006.01)
*H02G 3/16*      (2006.01)
(Continued)

(52) U.S. Cl.
CPC ........... *H02G 3/16* (2013.01); *B60R 16/0238* (2013.01); *H02G 3/081* (2013.01); *H05K 7/12* (2013.01)

(58) Field of Classification Search
CPC ...... H02G 3/16; H02G 3/081; B60R 16/0238; H05K 7/01
See application file for complete search history.

(56) References Cited

U.S. PATENT DOCUMENTS

2002/0157847 A1* 10/2002 Chiriku ............... B60R 16/0238
                                                                174/50
2015/0365015 A1* 12/2015 Ito .......................... H01F 37/00
                                                                363/131

FOREIGN PATENT DOCUMENTS

CN         104242179 A       12/2014
JP         H11-017318 A      1/1999
(Continued)

OTHER PUBLICATIONS

International Search Report, Application No. PCT/JP2018/017884, dated Jul. 10, 2018. ISA/Japan Patent Office.

*Primary Examiner* — Pete T Lee
(74) *Attorney, Agent, or Firm* — Honigman LLP

(57) ABSTRACT

An electrical junction box includes: a circuit board to which an electronic component is connected; and a frame positioned with respect to the circuit board. The frame integrally includes a sub frame that surrounds at least part of a periphery of the electronic component. The sub frame is provided with a holding portion that holds the electronic component in the holding portion.

3 Claims, 17 Drawing Sheets

(51) Int. Cl.
*B60R 16/023* (2006.01)
*H02G 3/08* (2006.01)
*H05K 7/12* (2006.01)

(56) References Cited

FOREIGN PATENT DOCUMENTS

| | | | |
|---|---|---|---|
| JP | 2002330524 | A | 11/2002 |
| JP | 2004-296818 | A | 10/2004 |
| JP | 2007-173632 | A | 7/2007 |
| JP | 2014-207821 | A | 10/2014 |
| JP | 2015-089179 | A | 5/2015 |
| KR | 10-0631125 | B1 | 10/2006 |

\* cited by examiner

ELECTRICAL JUNCTION BOX

CROSS-REFERENCE TO RELATED APPLICATIONS

This application is the U.S. national stage of PCT/JP2018/017884 filed May 9, 2018, which claims priority of Japanese Patent Application No. JP 2017-098980 filed May 18, 2017, the contents of which are incorporated herein.

TECHNICAL FIELD

The technology disclosed herein relates to an electrical junction box.

BACKGROUND

As an apparatus for transmitting and interrupting current to in-vehicle electrical components, there has been conventionally known an electrical junction box that includes a circuit board on which various electronic components are mounted in a case.

Some of the electronic components mounted on the board in such an electrical junction box include a relatively large one, such as an inductor, which is connected to the conductive circuit on the board by soldering its terminal. However, the large electronic component is fixed by a separately provided fixing means because the electronic component connected only by the solder may become cracked due to vibration during running or the like. Specifically, the electronic component is fixed to the board with an adhesive applied to the periphery of the bottom surface of the electronic component or is mechanically fixed to the board by screwing or leaf springs.

However, in the configuration using the adhesive, it is necessary to provide a wider application area while avoiding other parts to prevent influence on the other parts. In addition, when the electronic component is to be mechanically fixed with screws or leaf springs, it is necessary to newly provide areas for fastening the screws or leaf springs on the board. Such fixing means becomes a factor to disturb the densification of the circuit board, and accordingly miniaturization of the electrical junction box.

Thus, a holding wall may be provided in the case such as a cover or a frame to surround and hold the electronic component. However, if there is a gap between the electronic component and the holding wall, the electronic component may rattle in the holding wall due to vibration from the vehicle and become deteriorated in connection reliability.

The technology disclosed herein has been completed under circumstances as describe above. An object of the technology is to provide an electrical junction box that is small in size and high in connection reliability and suppresses rattling of an electronic component.

SUMMARY

The technology disclosed herein is an electrical junction box that includes: a circuit board to which an electronic component is connected; and a frame positioned with respect to the circuit board. The frame integrally includes a sub frame that surrounds at least part of a periphery of the electronic component. The sub frame is provided with a holding portion that holds the electronic component in the holding portion.

According to this configuration, since the electronic component is firmly held by the holding portion provided in the sub frame, this suppresses rattling of the electronic component due to vibration. In addition, since the holding portion is provided in the sub frame provided integrated in the frame, there is no need to newly set an area for providing a fixing means for fixing the electronic component on the circuit board. This makes it possible to miniaturize the circuit board, and thus miniaturize the electrical junction box.

The electrical junction box may be configured as described below.

The holding portion may be a groove portion into which a protrusion portion on the electronic component is fitted.

The electronic component may include a coil having a wound portion around which a winding wire is wound, a magnetic core, and a bobbin disposed between the coil and the magnetic core. The protrusion portion may be the bobbin that protrudes from the coil and the magnetic core.

According to this configuration, it is possible to implement a specific form of the holding portion.

The holding portion may be a support portion that is interposed between the electronic component and the circuit board to support the electronic component from the circuit board side.

According to this configuration, even if the electronic component is large and heavy such as an inductor, for example, the support portion can suppress the rattling of the electronic component and maintain connection reliability.

The electronic component may include a coil having a wound portion around which a winding wire is wound in an annular shape. An axis of the wound portion may be arranged along the circuit board. The support portion may have a curved surface shape along a side surface of the wound portion extending in an axial direction.

According to this configuration, the support portion can more securely hold the electronic component (coil) so as not to rattle.

Advantageous Effects of Invention

According to the technology disclosed herein, it is possible to obtain an electrical junction box that is small in size and high in connection reliability and suppresses rattling of an electronic component.

DETAILED DESCRIPTION OF PREFERRED EMBODIMENTS

A first embodiment will be described with reference to FIGS. 1 to 11. An electrical junction box 10 of the present embodiment is disposed between a power source such as a battery and in-vehicle electrical components such as a lamp and a motor, and passes and interrupts power supplied from the power source to the in-vehicle electrical components. In the following description, the upper side of FIG. 4 is regarded as the front side or the upper side, and the lower side of FIG. 4 is regarded as the back side or the lower side.

Figure 1:
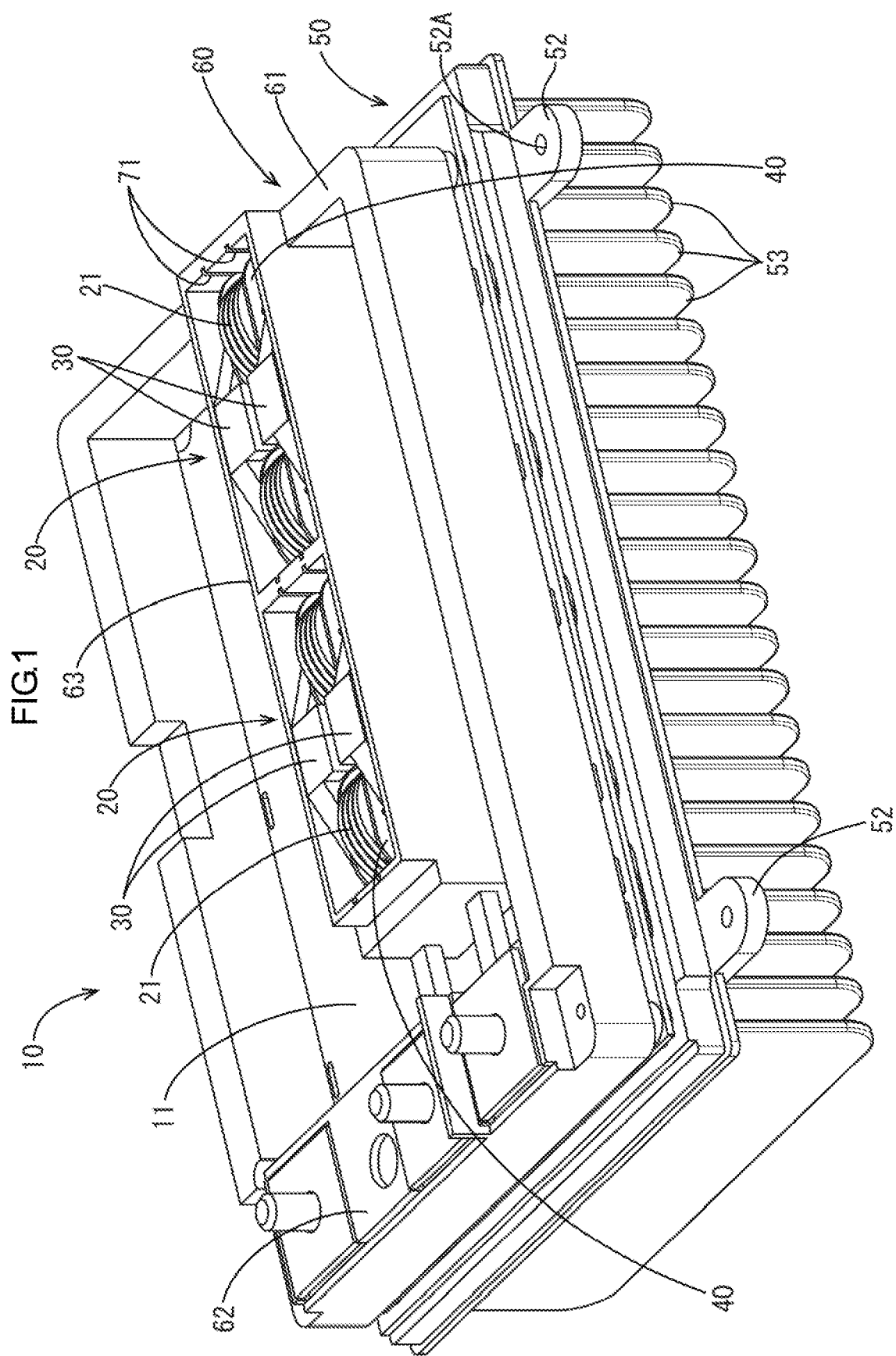
FIG. 1 is a perspective view of an electrical junction box with a cover not illustrated, according to a first embodiment.
Figure 2:
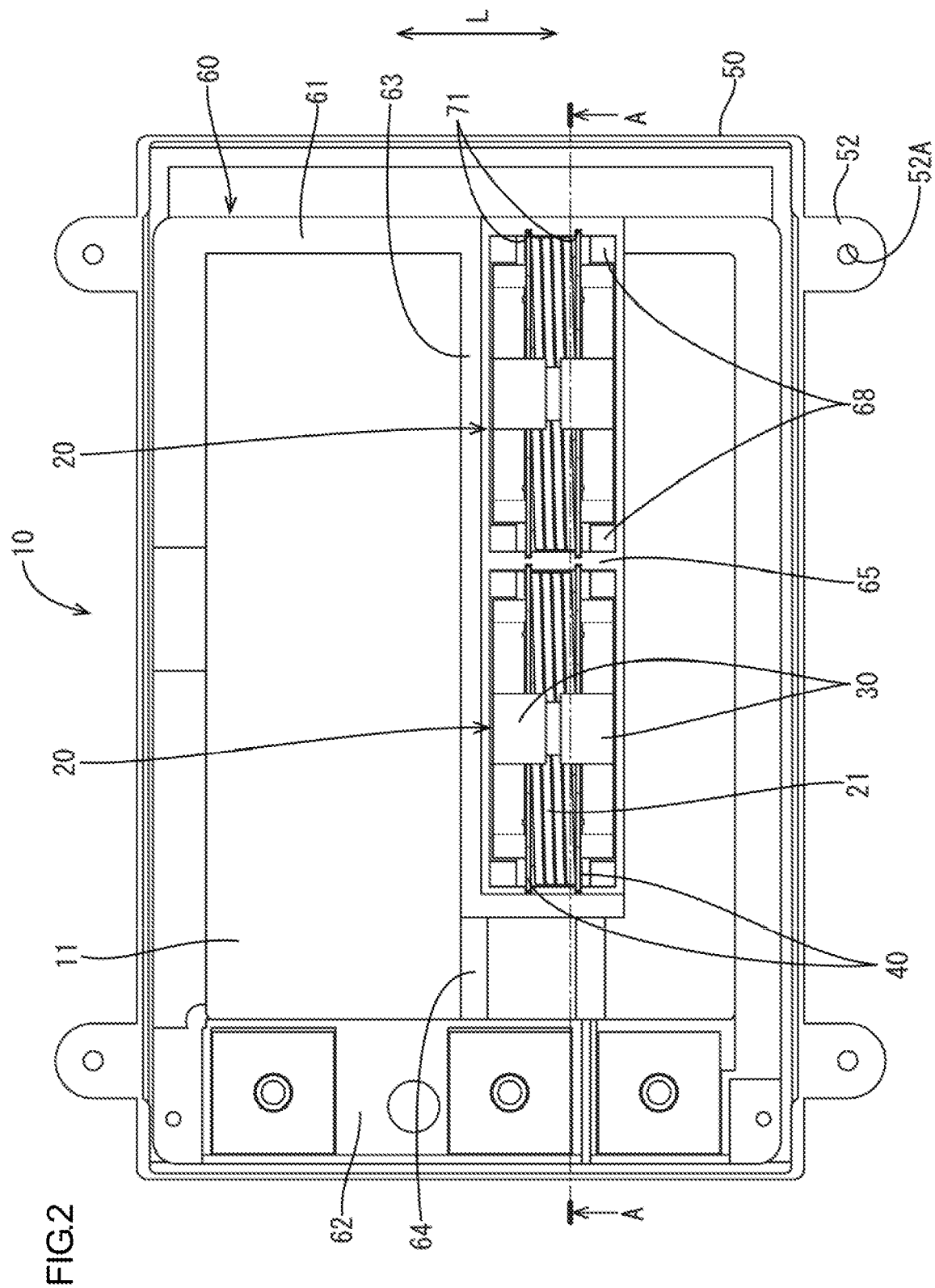
FIG. 2 is a plan view of the electrical junction box with the cover not illustrated.
Figure 4:
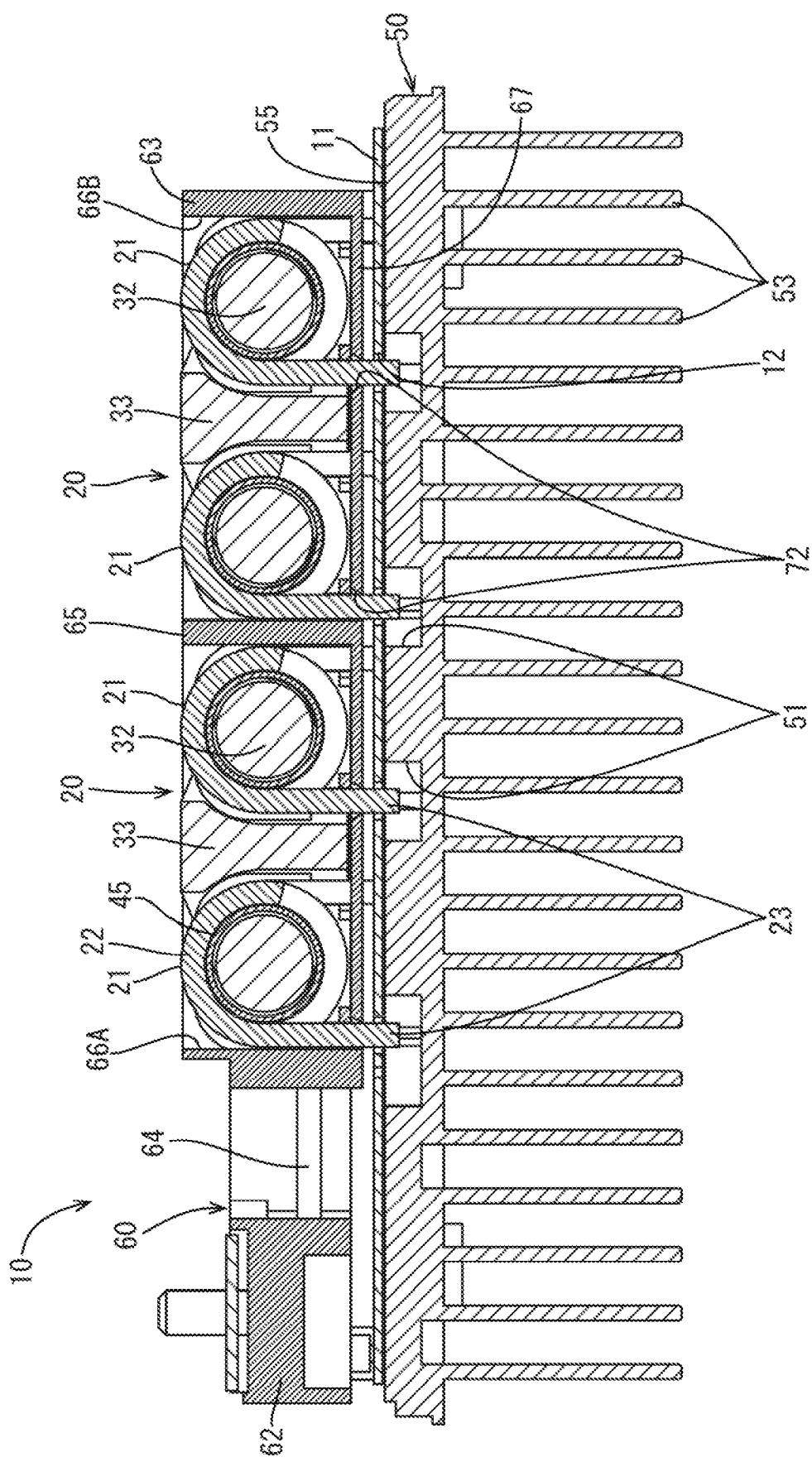
FIG. 4 is a cross-sectional view of FIG. 2 taken along line A-A.

As illustrated in FIGS. 1 and 4, the electrical junction box 10 includes a circuit board 11, a heatsink 50 disposed on the back surface (the lower surface in FIG. 4) of the circuit board 11, and a frame 60 positioned with respect to the circuit board 11, and a cover (not shown) that covers the circuit board 11 from the side opposite to the heatsink 50 (the upper side of FIGS. 1 and 4).

The circuit board 11 is structured such that a conductive circuit (not shown) is formed on an insulating substrate by a printed wiring technique, and a plurality of electronic components is mounted at predetermined positions on the conductive circuit. The plurality of electronic components is connected to one surface (front surface) of the circuit board 11.

The circuit board 11 is substantially rectangular in shape, and has a plurality of connection through holes 12 provided at predetermined positions. These connection through holes 12 are intended for connecting electronic components to the conductive circuit, and the electronic components are connected to the conductive circuit in the connection through holes 12 by a known method such as soldering, for example.

In relation to the present embodiment, among the plurality of electronic components, only a relatively large inductor 20 is illustrated and other electronic components are omitted in the drawings.

The inductor 20 used in the present embodiment has a coupled inductor structure, and includes a pair of coils 21 formed by winding a winding wire, a magnetic core 30, and a bobbin 40.

Each of the coils 21 is an edgewise coil 21 formed by winding a rectangular wire in an edgewise and annular shape. For example, as illustrated in FIG. 5, each of the coils 21 is formed from a wound portion 22 that is wound in a cylindrical shape as a whole, and a pair of lead terminals 23 that is extended from both ends of the wound portion 22 as seen in an axial direction L to the same direction (downward direction) and in parallel to each other and is connected to the conductive circuit.

Figure 5:
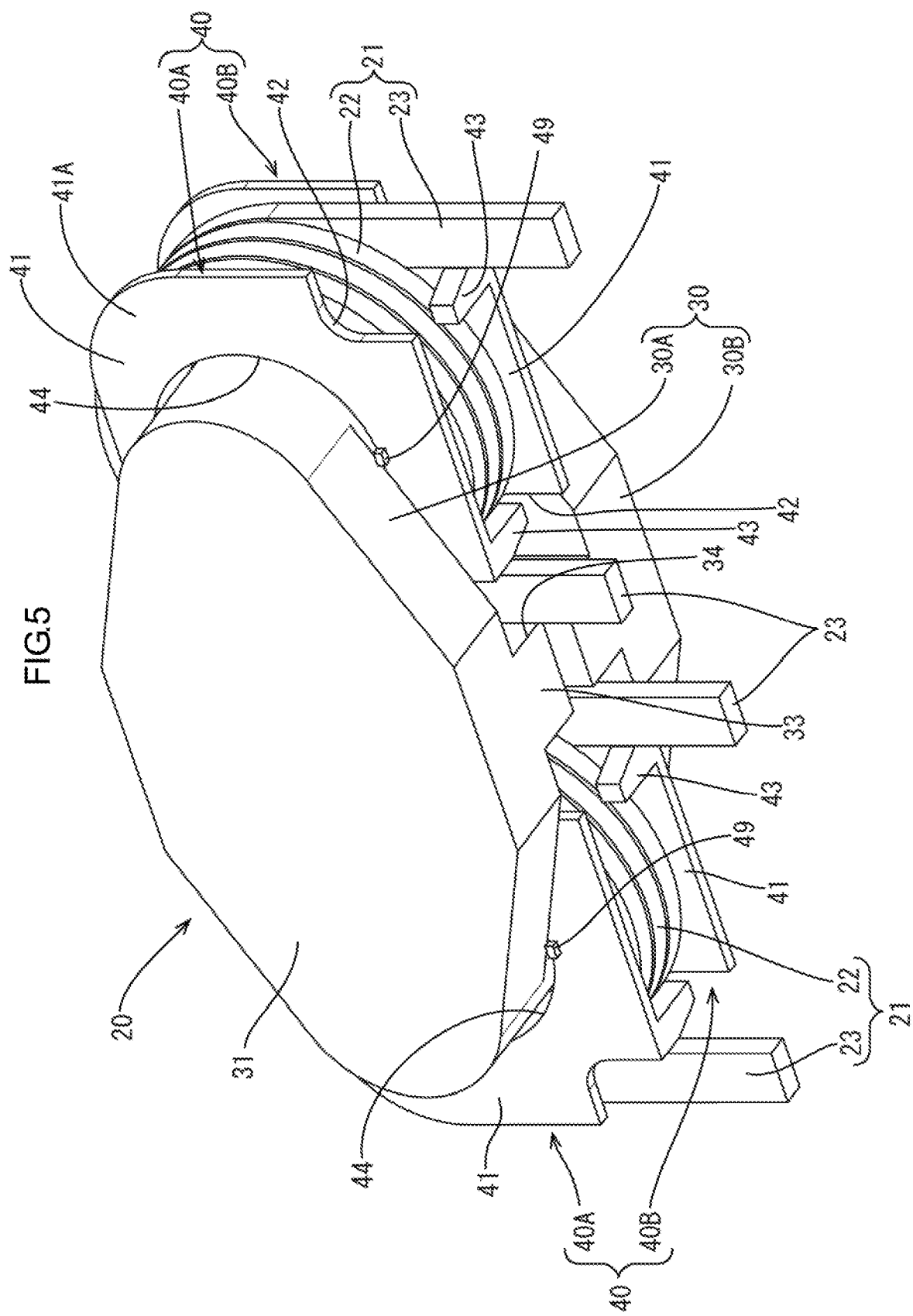
FIG. 5 is a perspective view of an inductor.
Figure 6:
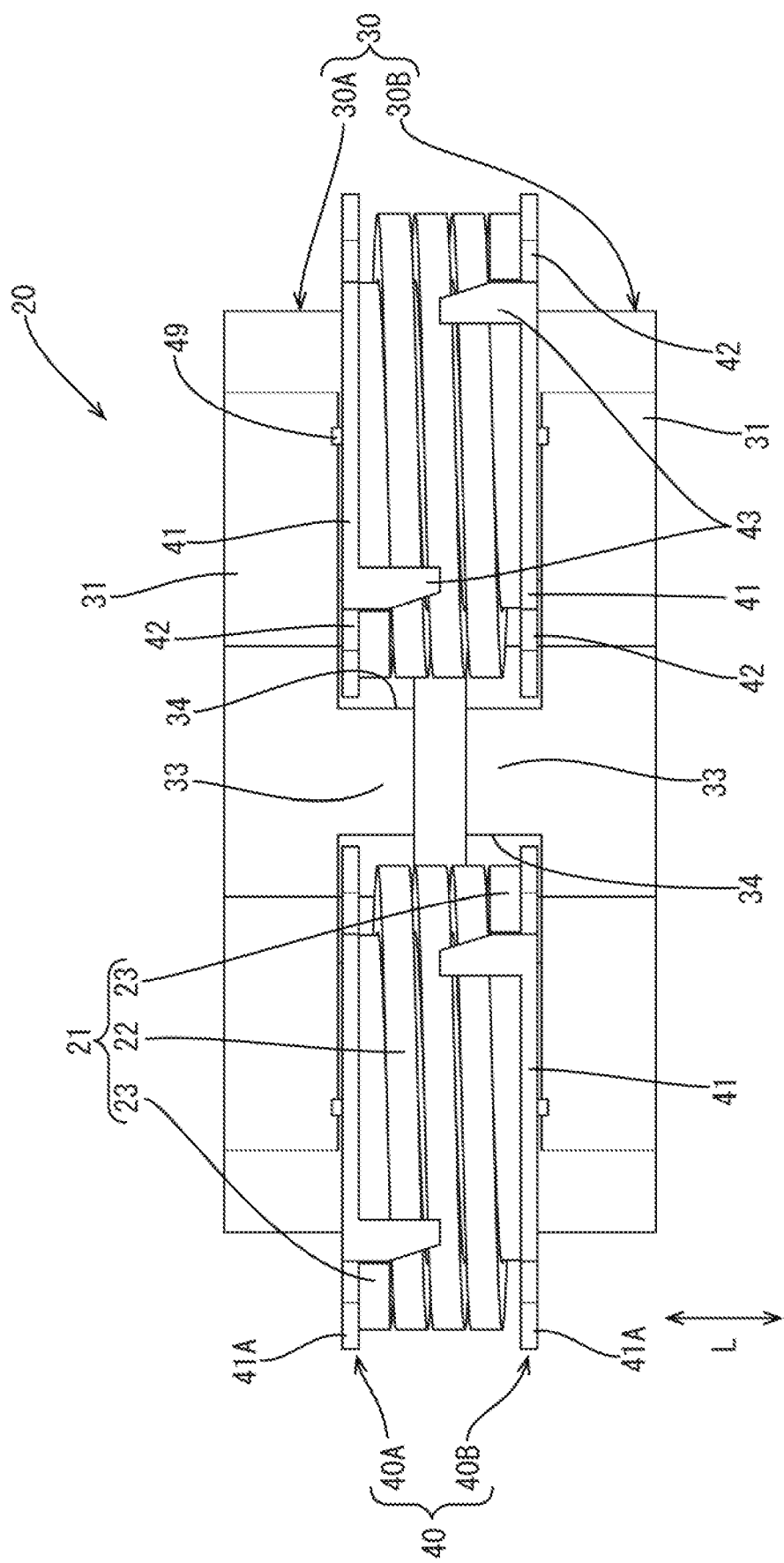
FIG. 6 is a bottom view of the inductor.

As illustrated in FIGS. 4 to 6, the magnetic core 30 is formed by combining a pair of first core 30A and second core 30B having the same shape and size. The first core 30A and the second core 30B each have a substantially oval thick plate-shaped core-side bottom wall portion 31, and are arranged such that the core-side bottom wall portions 31 are opposed to each other.

A pair of columnar side legs 32 is provided at both longitudinal ends of each core-side bottom wall portion 31 and is extended toward the opposed core (see FIG. 4). In addition, a plate-shaped central leg 33 is provided at the central portion of each core-side bottom wall portion 31 so as to face the opposed core and extend along a short direction. The central leg 33 has thick end portions along the side surfaces of the wound portions 22 in a state where the wound portions 22 of the coils 21 are arranged around the side legs 32. In addition, the areas where the lead terminals 23 are arranged in the end portions of the central leg 33 constitute escape portions 34 that are cut out to allow the lead terminals 23 to escape (see FIG. 5).

The rising dimension (height dimension) of the side legs 32 and the central leg 33 from the core-side bottom wall portion 31 is set such that the side leg 32 is slightly longer. Thus, in a state where the pair of first core 30A and second core 30B is combined, the end surfaces of the central legs 33 opposed to each other are separated from each other to form a gap.

The bobbin 40 is interposed between the coil 21 and the magnetic core 30. The bobbin 40 is made of an insulating resin. As illustrated in FIGS. 5 and 6, the bobbin 40 is formed from a pair of first bobbin body 40A and second bobbin body 40B of the same shape and the same size that is disposed at both ends of the wound portion 22 of the coil 21 as viewed from an axial direction L.

Figure 7:
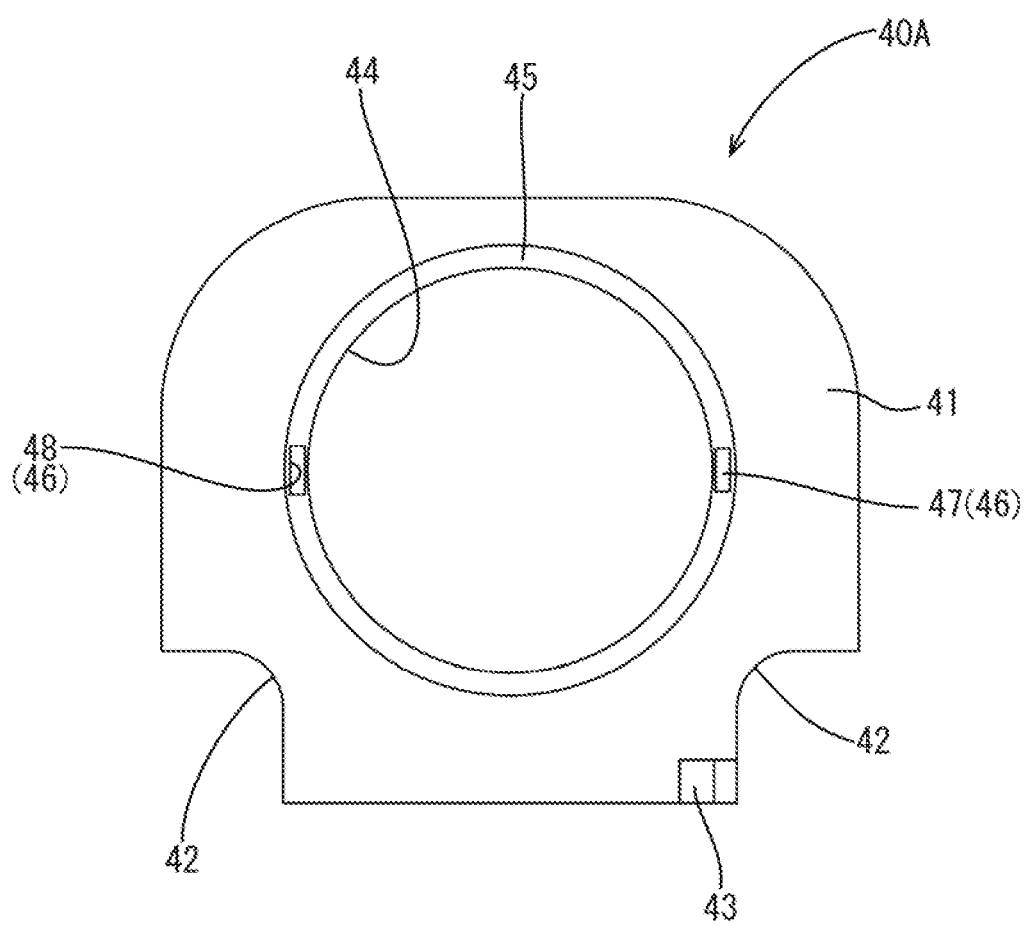
FIG. 7 is a front view of a bobbin.

The first bobbin body 40A and the second bobbin body 40B each have a plate-shaped bobbin-side bottom wall portion 41. As illustrated in FIG. 7, each of the bobbin-side bottom wall portions 41 has a slightly horizontally long, substantially rectangular shape with chamfered corner portions. Among the four corner portions, a pair of corner portions adjacent to each other in the longitudinal direction (the lower corner portions illustrated in FIG. 7) constitutes cutout portions 42 that are cut out inward in a substantially rectangular shape.

Figure 8:
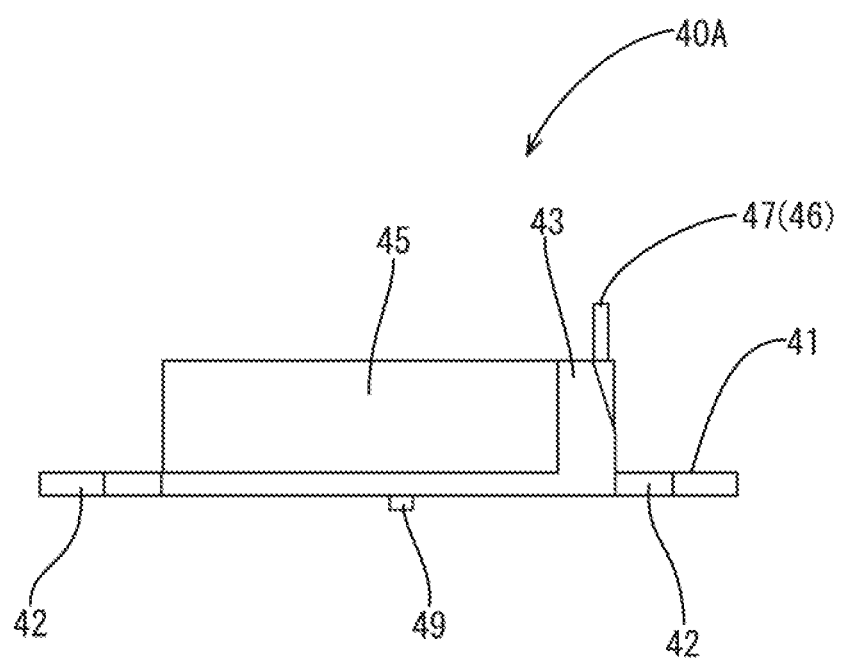
FIG. 8 is a bottom view of the bobbin.

In addition, out of the pair of cutout portions 42, one cutout portion 42 (on the right side of FIG. 7) has a restrictive protruding piece 43 that rises vertically from the plate surface of the bobbin-side bottom wall portion 41 at a corner on one side as viewed from the longitudinal direction (horizontal direction in FIG. 7) (see FIG. 8). As illustrated in FIG. 6, the restrictive protruding piece 43 is set to have a height dimension that is approximately half the height dimension of the wound portion 22 of the coil 21. The restrictive protruding piece 43 has a sloped shape that is cut obliquely such that the surface on the cutout portion 42 side becomes thinner toward the tip.

Each of the bobbin-side bottom wall portions 41 has a hole 44 for penetration of the columnar side leg 32 of the magnetic core 30 at the center thereof. A cylindrical division wall 45 is provided at the hole edge of the hole 44 to rise in the same direction as the restrictive protruding piece 43. The projecting dimensions of the division wall 45 and the restrictive protruding piece 43 from the bobbin-side bottom wall portion 41 are the same.

Locking portions 46 are provided at both ends of the division wall 45 as seen in the alignment direction of the cutout portions 42 (the horizontal direction in FIG. 7). Specifically, an elongated rectangular bar-like locking projection 47 is provided at the end on the right side of FIG. 7 (see FIG. 8), and a locking recess 48 is provided at the end on the left side of FIG. 7 into which the opposed locking projection 47 of the second bobbin body 40B is to be fitted. The pair of bobbin bodies 40A and 40B is assembled together by fitting the locking projection 47 and the locking recess 48.

On the surface of the bobbin-side bottom wall portion 41 opposite to the surface on which the division wall 45 is raised, as illustrated in FIGS. 5 and 8, a pair of support protrusions 49 is provided to protrude outward from the vertical edges of the hole 44. The pair of support protrusions 49 is intended for positioning the magnetic core 30 by contact with the side surface of the magnetic core 30 to prevent the rotation of the magnetic core 30.

FIGS. 5 and 6 illustrate the inductor 20 in which the coils 21, the magnetic core 30, and the bobbin 40 are assembled. The inductor 20 is formed such that the pair of coils 21 is arranged side by side with the axis L of the wound portions 22 oriented to be parallel and horizontal, and each of the coils 21 is sandwiched in the bobbin 40 (between the first bobbin body 40A and the second bobbin body 40B), and each of the coils 21 is collectively sandwiched in the magnetic core 30 (between the first core 30A and the second core 30B) from the outside.

The pair of bobbin bodies 40A and 40B is assembled together by the locking portion 46 (the locking projection 47 and the locking recess 48) provided on the division wall 45. Thus, the wound portion 22 of the coil 21 is sandwiched between the pair of bobbin-side bottom wall portions 41. Further, the pair of cores 30A and 30B is positioned with respect to the bobbin 40 by the support protrusion 49, and is bonded together with the side legs 32 abutted.

In this assembled state, the wound portions 22 of the pair of coils 21 are arranged around the side legs 32 of the first core 30A and the second core 30B with the division wall 45 of the bobbin 40 therebetween. In addition, two pairs (four) of lead terminals 23 in the pair of coils 21 are extended in the same direction (downward in FIG. 5) while avoiding interference with the magnetic core 30 by the escape portion 34 of the magnetic core 30. The central legs 33 are interposed between the pair of coils 21 arranged side by side. At this time, the end surfaces of the pair of central legs 33 facing each other are arranged apart from each other, and a gap is formed between them.

Each of the bobbins 40 is prevented from rotating with respect to the pair of first core 30A and second core 30B by the support protrusion 49. Further, in each of the coils 21, the wound portion 22 is supported from the lower side by the restrictive protruding piece 43, and the lead terminal 23 interferes with the restrictive protruding piece 43, so that the coil 21 is prevented from rotating with respect to the bobbin 40 and the magnetic core 30.

Further, in the assembled state, each of the bobbins 40 partially protrudes outward from the coil 21 and the magnetic core 30. Specifically, as illustrated in FIGS. 5 and 6, the bobbin 40 has protrusions 41A protruding outward from the coil 21 and the magnetic core 30 at both ends of the bobbin-side bottom wall portion 41 as seen in the longitudinal direction of the inductor 20 (the horizontal direction in FIG. 6).

The heatsink 50 is disposed on the lower surface side of the circuit board 11. The heatsink 50 is a heat radiating member made of a metal material excellent in thermal conductivity, such as aluminum or aluminum alloy, and has a function of radiating heat generated in the circuit board 11.

An upper surface of the heatsink 50 has a substantially flat plate shape, and the circuit board 11 is disposed at a predetermined position via an insulating sheet 55. The insulating sheet 55 has adhesion and is fixable to the circuit board 11 and the heatsink 50.

In areas on the upper surface of the heatsink 50 where the inductors 20 are disposed, there are provided escape recesses 51 that are recessed downward from the upper surface to accommodate the lead terminals 23 of the coils 21 as illustrated in FIG. 4. The insulating sheet 55 has penetrating escape holes (not illustrated) at positions corresponding to the escape recesses 51.

Further, on the upper surface of the heatsink 50, there are provided projecting portions 52 that project outward in the vicinity of both end portions of the side edges extending in the longitudinal direction. These projecting portions 52 have fixing holes 52A for fastening covers (not illustrated) by bolts.

In addition, a large number of plate-shaped fins 53 extending downward is provided on the lower surface of the heatsink 50 (see FIG. 1).

Figure 9:
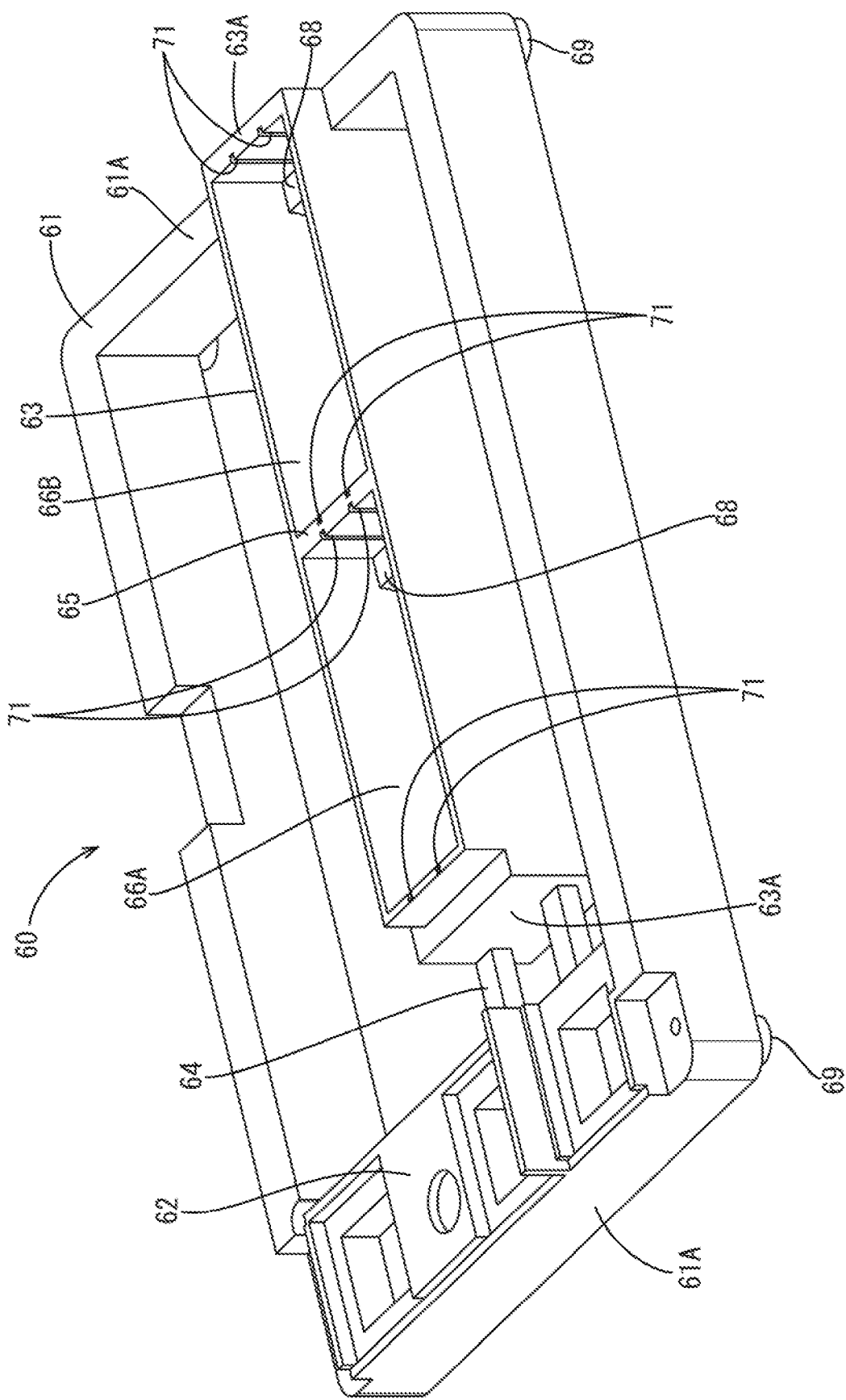
FIG. 9 is a perspective view of a frame.
Figure 10:
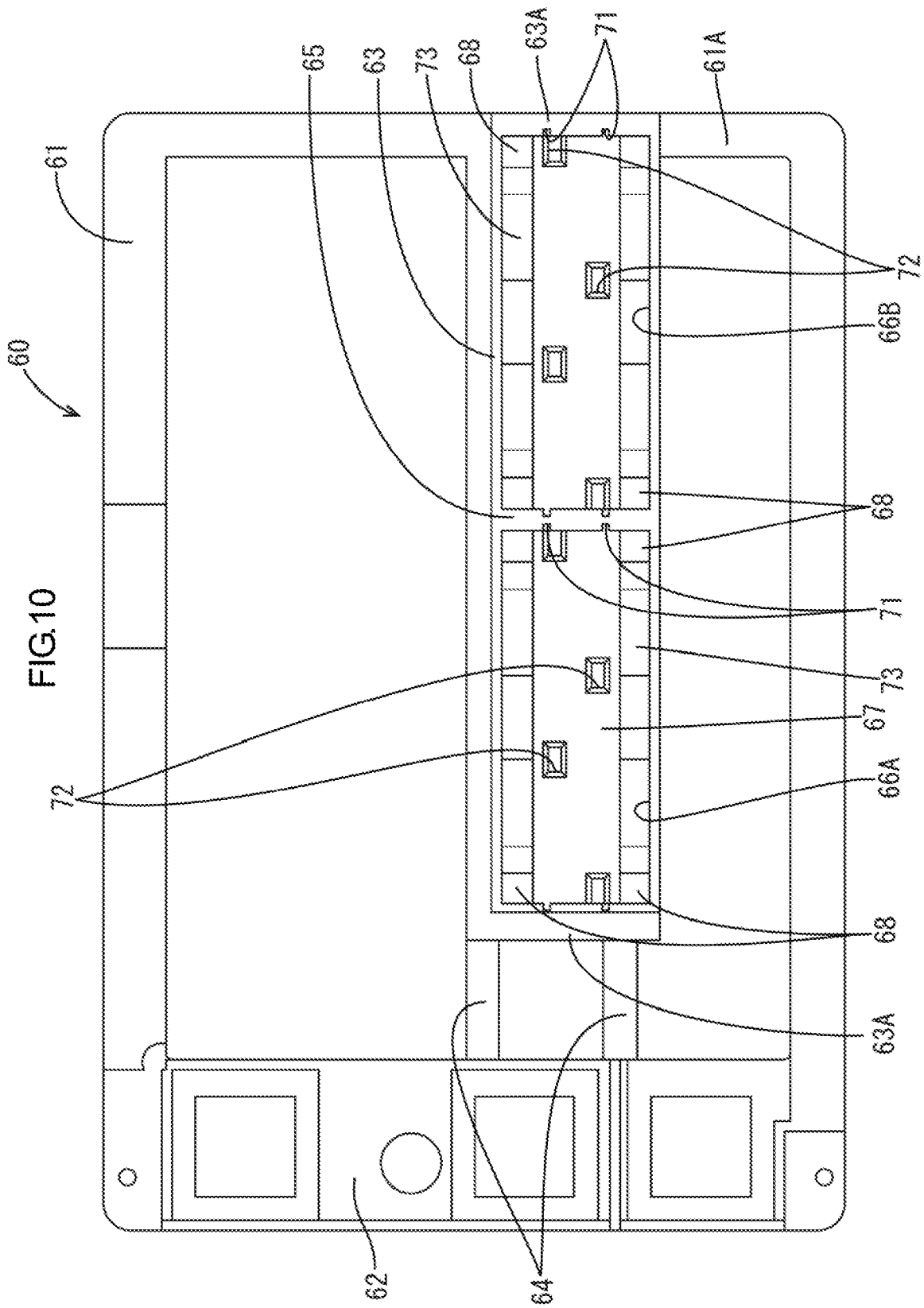
FIG. 10 is a plan view of the frame.
Figure 11:
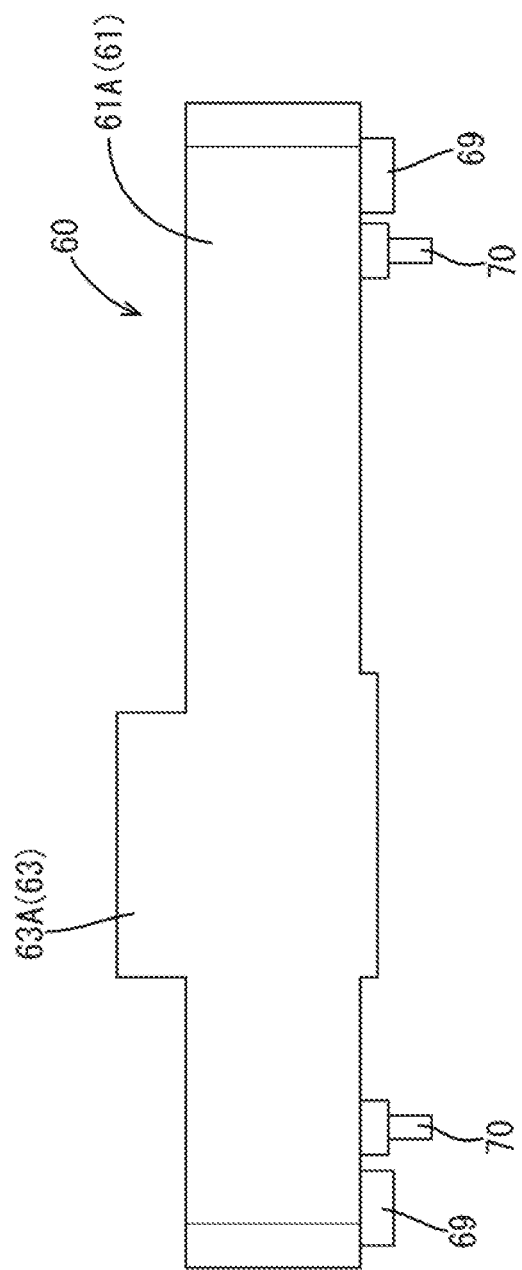
FIG. 11 is a side view of the frame.
Figure 12:
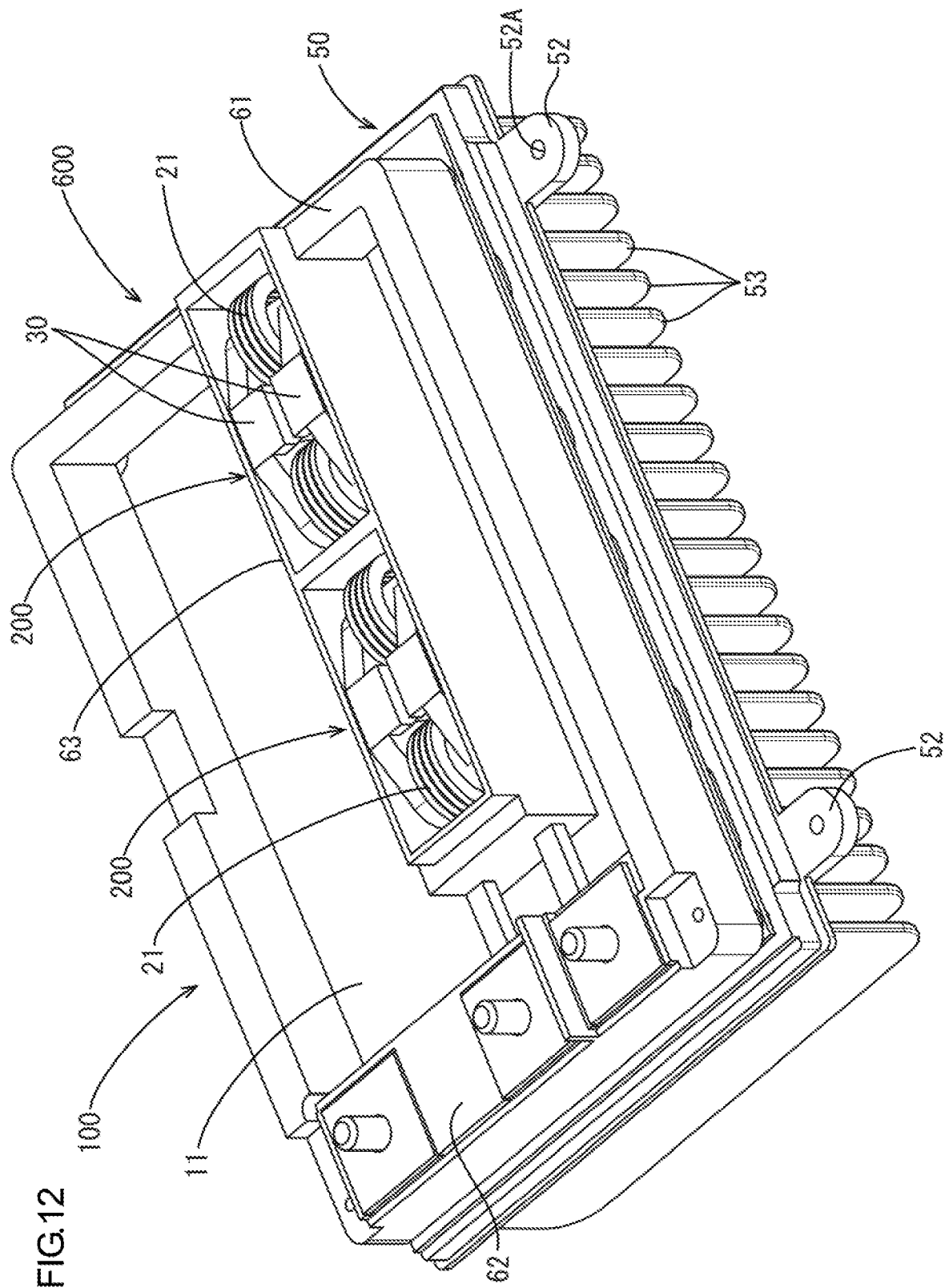
FIG. 12 is a perspective view of an electrical junction box with a cover not illustrated according to a second embodiment.
Figure 13:
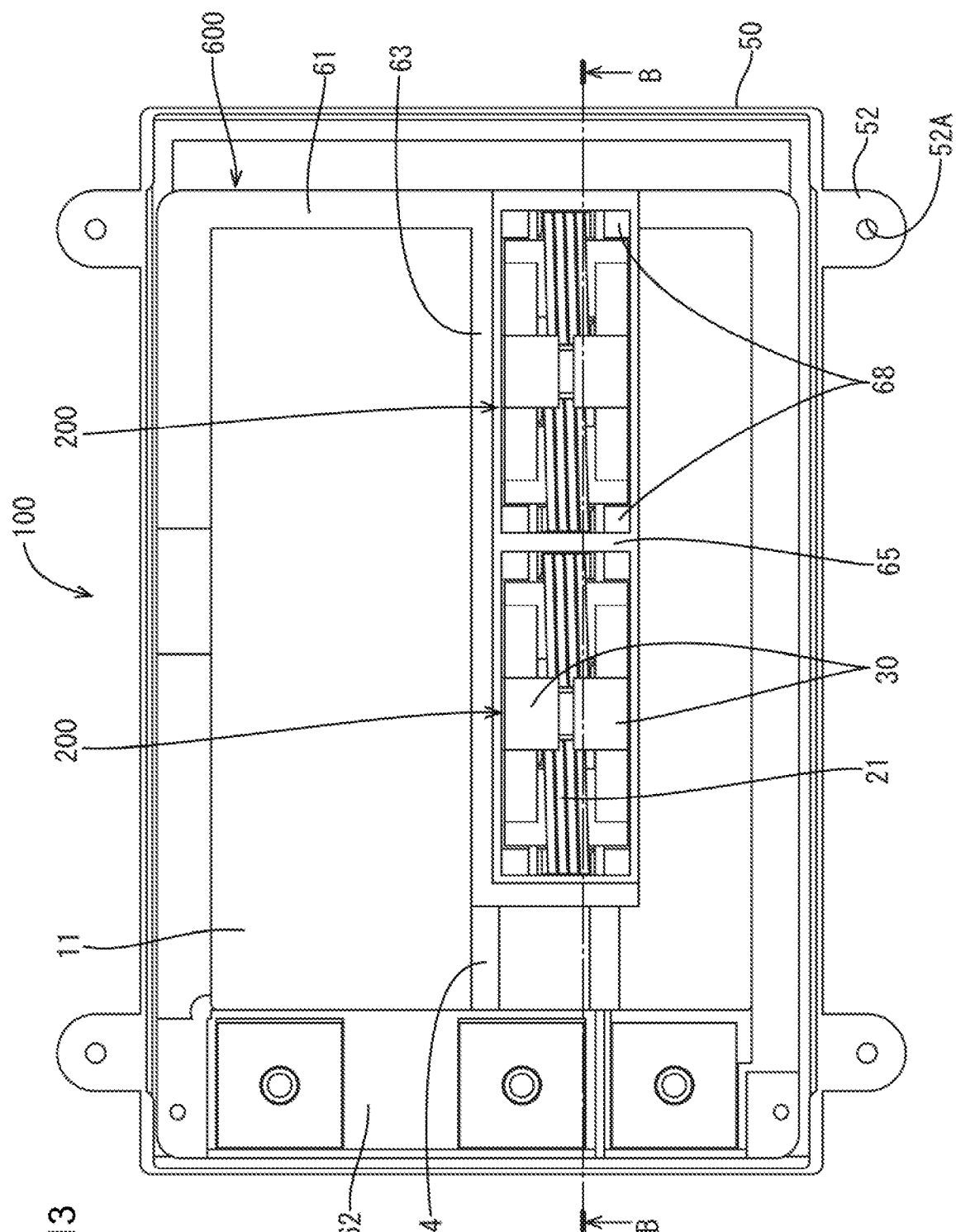
FIG. 13 is a plan view of the electrical junction box with the cover not illustrated.
Figure 14:
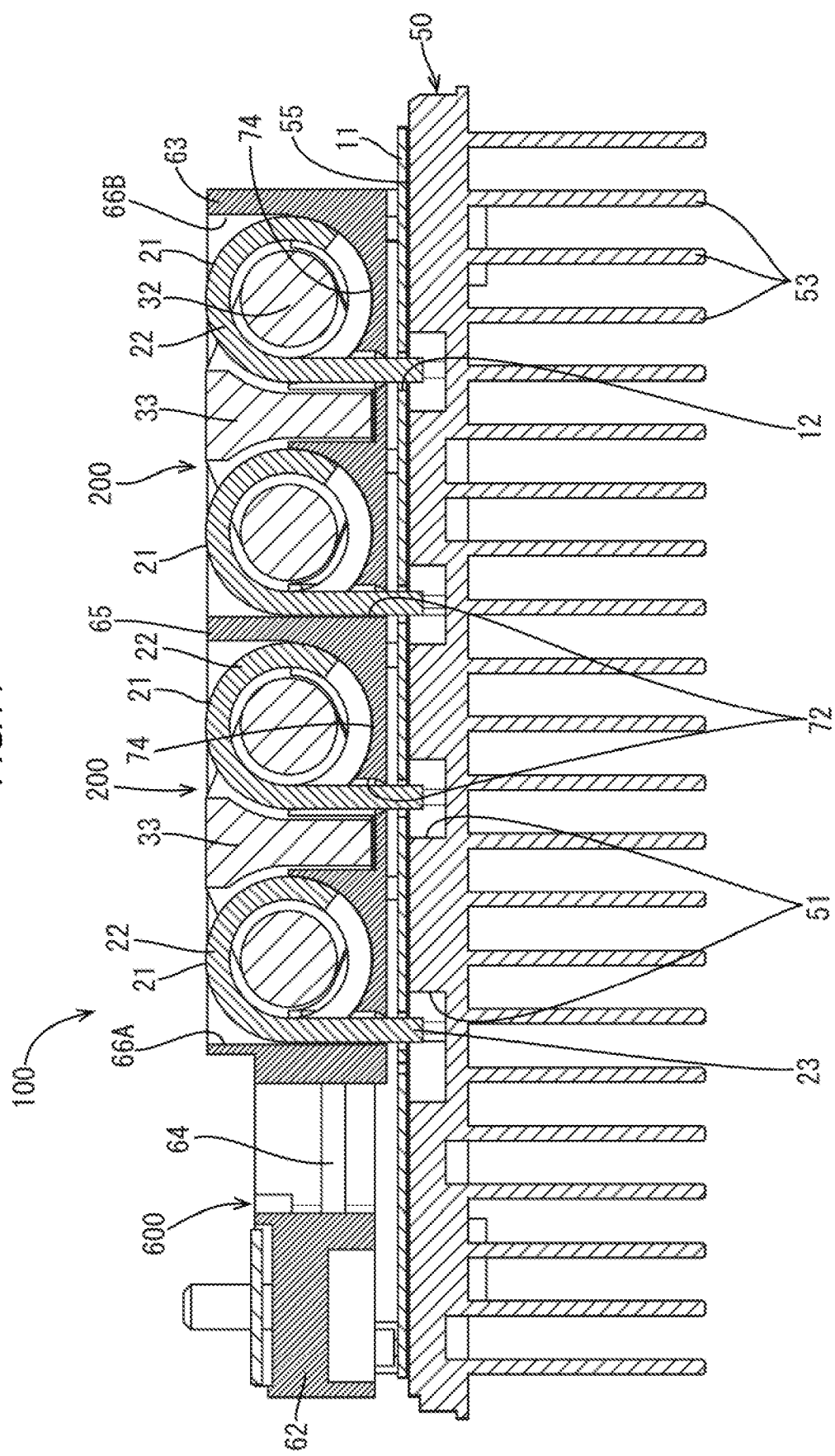
FIG. 14 is a cross-sectional view of FIG. 13 taken along line B-B.

The frame 60 is made of a synthetic resin, and has a substantially rectangular outer frame 61 as illustrated in FIGS. 9 to 11.

On one of the pair of outer first side walls 61A extending along the short side of the outer frame 61, a terminal block 62 that projects inward to position and accommodate a plate-shaped terminal for connecting to an external terminal (not illustrated). A sub frame 63 is provided integrally with the outer frame 61 in the frame 60 at a position where the inductors 20 are disposed. In the present embodiment, the two inductors 20 are provided side by side, and the sub frame 63 has an elongated rectangular cylindrical shape that surrounds the periphery of these inductors 20 to fit the inductors 20 inside almost closely.

One side (the right side of FIG. 9) of a pair of inner first side walls 63A extending along the short side of the sub frame 63 is integrated with the outer frame 61. In addition, the inner first side wall 63A on the other side (the left side of FIG. 9) is provided with a pair of bridging portions 64 that extends outward and is integrated with the terminal block 62.

The sub frame 63 has a partition wall 65 dividing the interior into two regions. The pair of regions surrounded by the partition wall 65 and the sub frame 63 constitutes a first housing portion 66A and a second housing portion 66B into which the two inductors 20 are to be fit.

As illustrated in FIG. 4, the sub frame 63 has a bottom wall 67 that connects to the lower end of the sub frame 63. On sides of the bottom wall 67 closer to a pair of side edges extending in the longitudinal direction (sides closer to the side edges extending in the horizontal direction in FIG. 10), core receiving portions 73 (an example of the support portions) shaped along the bottom surfaces of the magnetic cores 30 are provided to rise from the bottom wall 67 in a state where the inductors 20 are housed in the housing portions 66A and 66B. Further, terminal through holes 72 for penetration of the lead terminals 23 are formed in the bottom wall 67 at positions corresponding to the lead terminals 23 in a state where the inductors 20 are housed in the housing portions 66A and 66B. The terminal through holes 72 have a tapered shape in which the hole edge on the upper end side expands outward.

At four corners of the bottom wall 67 of the first housing portion 66A and the second housing portions 66B, there are provided projecting portions 68 that project inward and extend in the vertical direction (see FIG. 10). These projecting portions 68 are in contact with the side surfaces of the magnetic cores 30 in a state where the inductors 20 are housed in the housing portions 66A and 66B, thereby to suppress rattle of the housing portions 66A and 66B of the inductors 20 (see FIG. 2).

Figure 3:
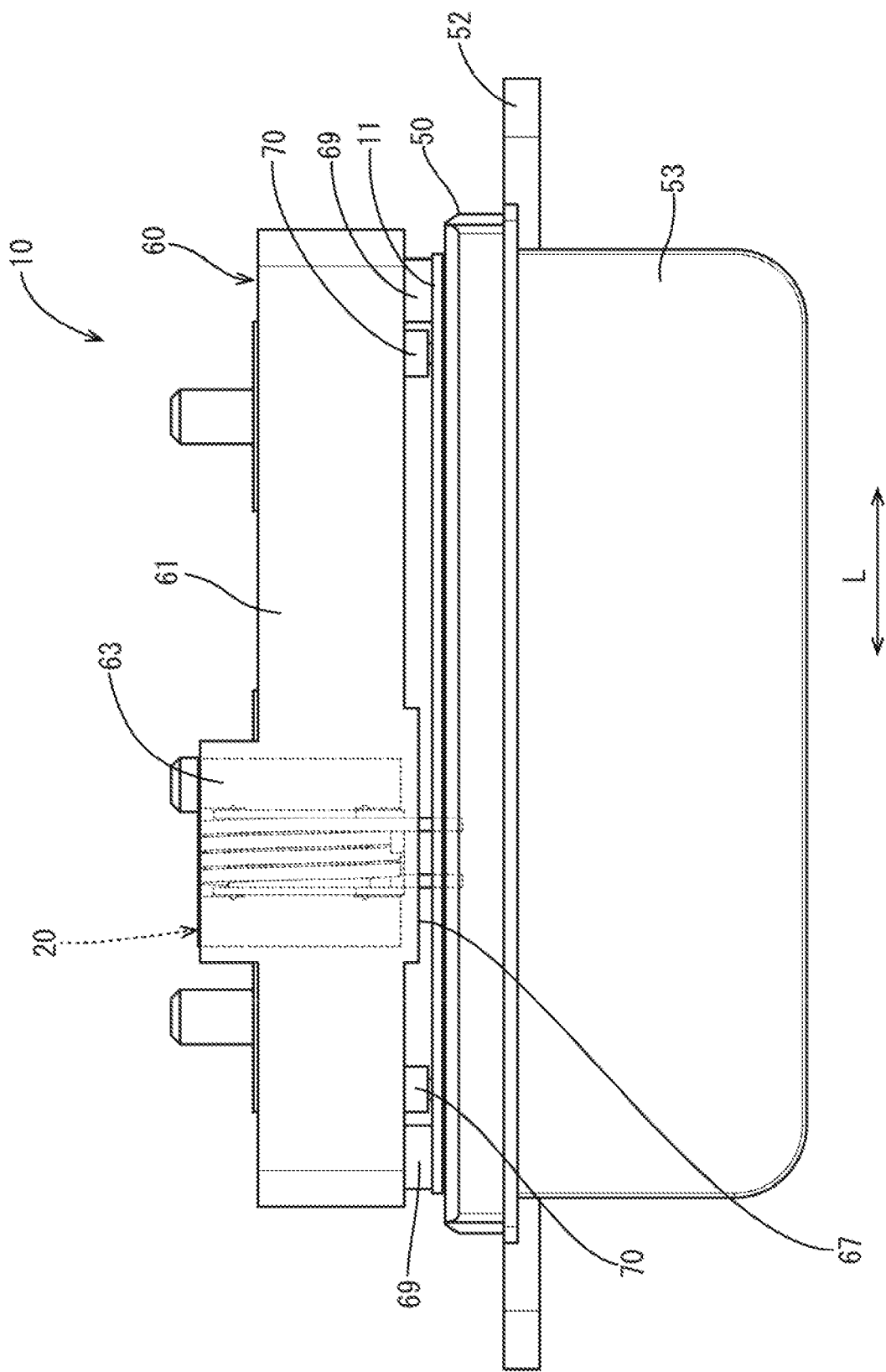
FIG. 3 is a side view of the electrical junction box with the cover not illustrated.

Note that the height dimension of the sub frame 63 is set to be enough for accommodating up to the upper surfaces of the inductors 20, and to be larger than the height dimension of the outer frame 61 such that the sub frame 63 protrudes upward from the outer frame 61 (see FIG. 3).

On the lower surfaces of the four corners of the outer frame 61, legs 69 are provided to protrude downward as illustrated in FIG. 11. In addition, next to the pair of legs 69 on the outer first side wall 61A with the terminal block 62, there is provided positioning convex portions 70 that protrude toward the heatsink 50 (downward). When these positioning convex portions 70 are fitted into positioning concave portions (not illustrated) provided on the upper surface of the heatsink 50, the frame 60 is positioned with respect to the heatsink 50.

The sub frame 63 includes holding portions that hold the inductors 20 at predetermined positions with respect to the circuit board 11. More specifically, there is provided a pair of holding grooves 71 for fitting the protrusions 41A of the bobbin 40 side by side in the inner first side wall 63A and the partition wall 65 of the sub frame 63. The holding groove 71 is formed in a groove shape that extends downward from the upper end surfaces of the sub frame 63 and the partition wall 65 and opens toward the inside of each of the housing portions 66A and 66B (see FIG. 9).

The configuration of the electrical junction box 10 of the present embodiment has been described so far. Next, the operations and effects of the electrical junction box 10 will be described.

In the electrical junction box 10 of the present embodiment, the frame 60 is integrally provided with the sub frame 63 surrounding the periphery of the inductors 20, and the outwardly protruding protrusions 41A of the bobbins 40 in the inductors 20 are fitted into the holding grooves 71 in the sub frame 63.

According to this configuration, in order to house the inductors 20 in the housing portions 66A and 66B, the protrusions 41A enter into the holding grooves 71 such that the inductors 20 are guided in a normal posture. In addition, each of the inductors 20 is configured such that the pair of lead terminals 23 in the vertically oriented coils 21 are inserted into the terminal through holes 72 in the bottom wall 67, the magnetic core 30 is supported by the core receiving portion 73, and the protrusions 41A are fitted into the holding grooves 71 such that the inductor 20 is firmly held in the sub frame 63. This suppresses the inductors 20 from rattling on the circuit board 11 due to vibration of the vehicle.

Moreover, the holding portions, that is, the holding grooves 71 into which the protrusions 41A are fitted, are formed in the sub frame 63 integrated with the frame 60, so that there is no need to newly set an area for providing a fixing means for fixing the inductors 20 on the circuit board 11.

That is, according to the present embodiment, it is possible to obtain the electrical junction box 10 that is small-sized and has high connection reliability.

Next, a second embodiment will be described with reference to FIGS. 12 to 17.

Hereinafter, only the components different from those of the first embodiment will be described. The same components as those of the first embodiment will be denoted by the same reference symbols, and redundant description will be omitted.

Figure 15:
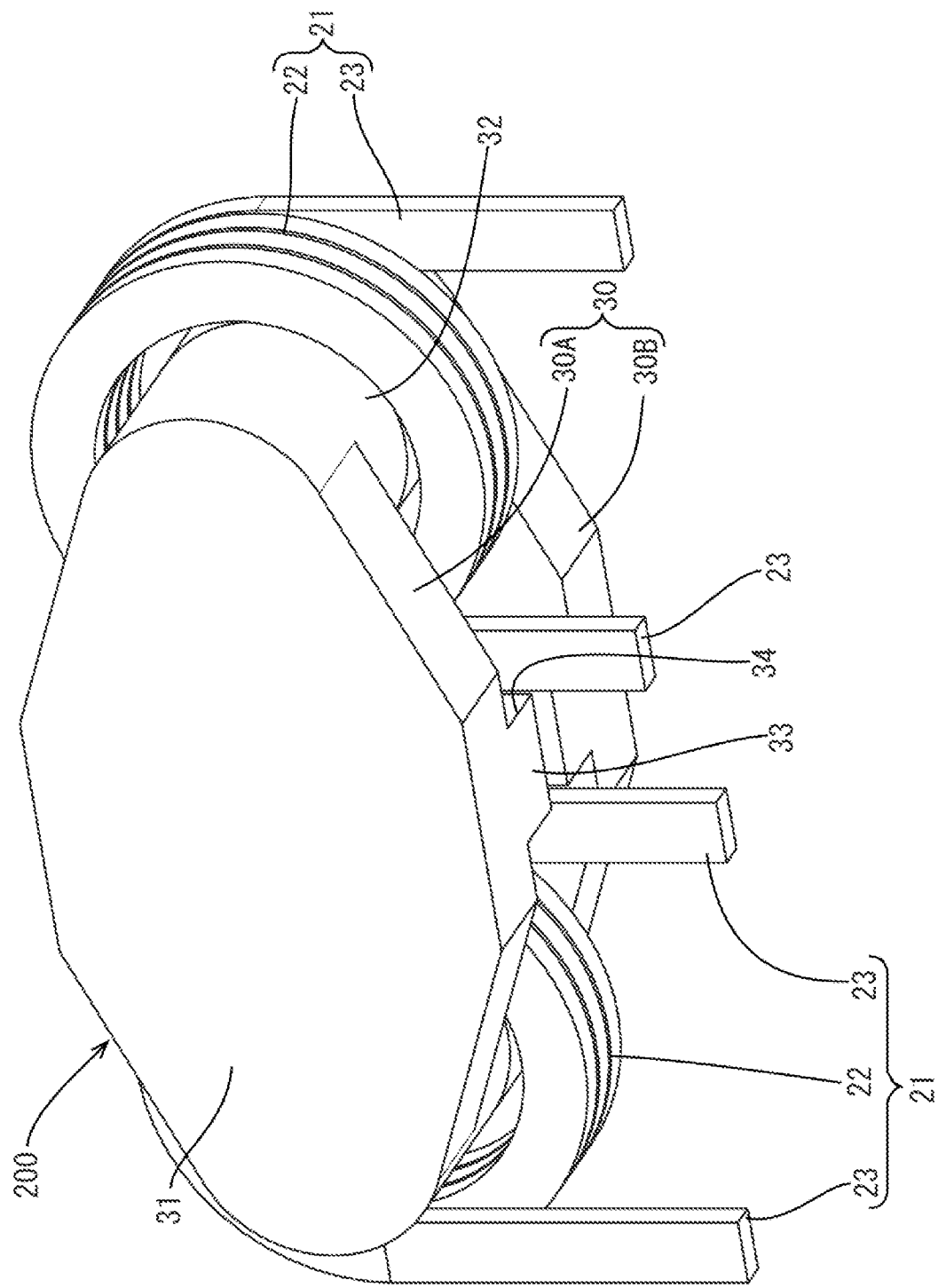
FIG. 15 is a perspective view of an inductor.
Figure 16:
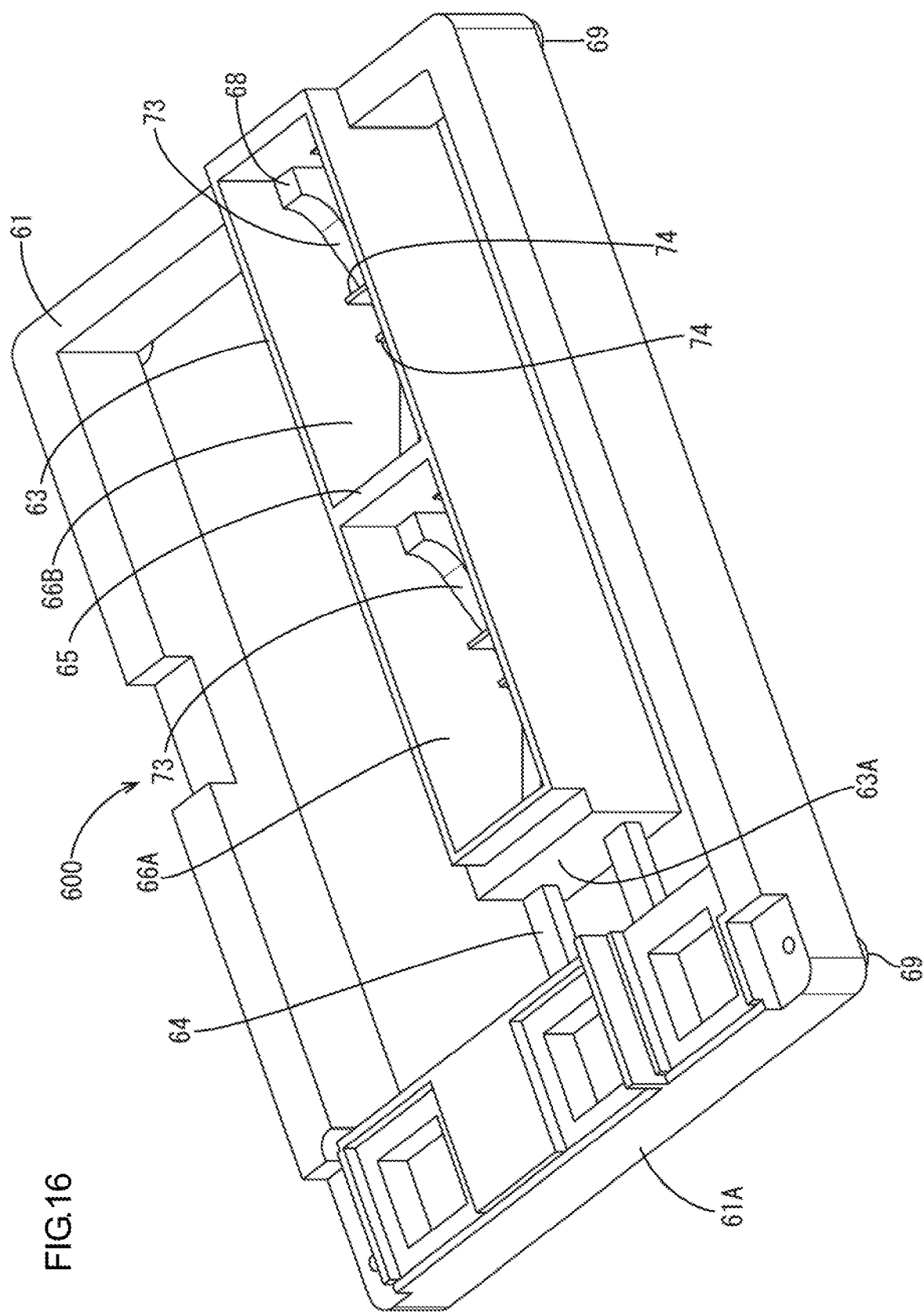
FIG. 16 is a perspective view of a frame.

An inductor 200 of the present embodiment is different from the inductor 20 of the first embodiment in that the bobbin 40 is not provided (see FIG. 15). In addition, the configurations of coils 21 and a magnetic core 30 are the same as those of the inductor 20 of the first embodiment. Since the bobbin 40 is not provided, the coils 21 and the magnetic core 30 are not relatively positioned, and the coils 21 are movably disposed around side legs 32 of the magnetic core 30.

Further, a sub frame 63 of a frame 600 of the present embodiment is different from the frame 60 of the first embodiment in that the holding grooves 71 are not provided.

Figure 17:
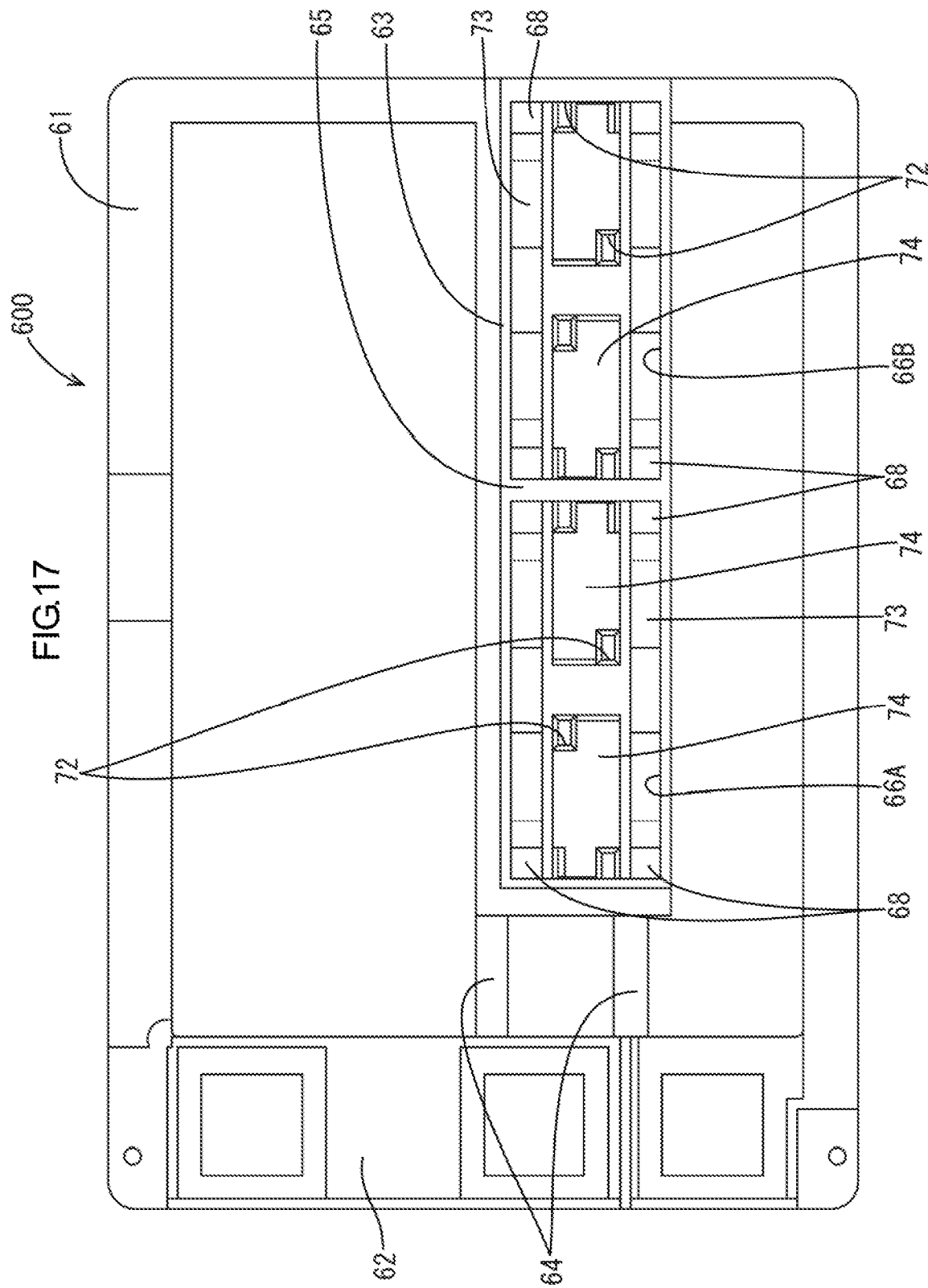
FIG. 17 is a plan view of the frame.

Furthermore, the frame 600 of the present embodiment is different from the first embodiment in that coil receiving portions 74 (an example of a holding portion and a support portion) are provided on an upper surface of a bottom wall 67 that is continuous with a lower end of the sub frame 63. Each of the coil receiving portion 74 has a curved surface shape along a side surface of a wound portion 22 of the corresponding coil 21 extending in an axial direction L (see FIG. 14). Further, a width of the coil receiving portion 74 as seen in the vertical direction in FIG. 17 is set to a dimension that allows the wound portion 22 to be fitted tightly (substantially the same as the height dimension of the wound portion 22).

Further, the coil receiving portions 74 have terminal through holes 72 for penetration of lead terminals 23 at predetermined positions. By the terminal through holes 72, the coils 21 are oriented in a normal direction.

When the inductors 200 are fitted into housing portions 66A and 66B, the magnetic cores 30 are supported from a circuit board 11 side by core receiving portions 73, and the wound portions 22 of the coils 21 are supported from the circuit board 11 side by the coil receiving portions 74. Thereby, the coils 21 are positioned relative to the magnetic cores 30, and rattling of the inductors 200 in the housing portions 66A and 66B is suppressed.

According to this configuration, even when a large heavy electronic component such as the inductors 200 is connected to the circuit board 11, the coil receiving portions 74 and the core receiving portions 73 suppress the rattling of the coils 21 and the cores. This maintains connection reliability.

Further, the coil receiving portions 74 have a curved surface shape along the side surface of the wound portion 22 extending in the axial direction L such that the coils 21 can be held more reliably without rattling.

Furthermore, even in the absence of the bobbins, the coils 21 and the magnetic cores 30 are positioned in the installed state, which reduces the number of parts and improves workability.

The technology disclosed herein is not limited to the embodiments described above and illustrated in the drawings. For example, the following embodiments also fall within the technical scope of the technology:

In the above embodiments, the inductors 20, 200 have lead type terminals. Alternatively, the inductors may have surface mount type terminals. In that case, the bottom wall 67 of the sub frame 63 can be omitted.

In the above embodiments, the sub frame 63 has a peripheral wall shape that surrounds the entire periphery of the inductors 20, 200. Alternatively, the sub frame 63 may be cut partially.

In the above embodiments, the holding portions are the groove portions (the holding grooves 71) or the support portions (the core receiving portions 73 and the coil receiving portions 74) as an example. However, the configuration of the holding portions is limited to that in the above embodiments. Instead, the configuration of the holding portions can be arbitrarily changed according to the form of the electronic components to be held, for example, such that the holding portions protrude inward from the side walls of the sub frame 63 to hold part of the electronic components.

In the above embodiments, the inductors 20, 200 are held as electronic components. However, the electronic components are not limited to inductors.

The invention claimed is:

1. An electrical junction box comprising:
   a circuit board to which an electronic component is connected, wherein the electronic component includes a coil having a wound portion around which a winding wire is wound in an annular shape, and an axis of the wound portion is arranged along the circuit board; and
   a frame positioned with respect to the circuit board;
   wherein the frame integrally includes a sub frame that surrounds at least part of a periphery of the electronic component; and
   the sub frame is provided with a holding portion that holds the electronic component in the holding portion, wherein the holding portion is a support portion that is disposed between the electronic component and the circuit board to support the electronic component from the circuit board side, and the support portion has a curved surface shape along a side surface of the wound portion extending in an axial direction.

2. The electrical junction box according to claim 1, wherein the holding portion is a groove portion into which a protrusion portion on the electronic component is fitted.

3. The electrical junction box according to claim 2, wherein the electronic component includes a coil having a wound portion around which a winding wire is wound, a magnetic core, and a bobbin disposed between the coil and the magnetic core, and the protrusion portion is the bobbin that protrudes from the coil and the magnetic core.

* * * * *